US006664132B1

(12) United States Patent
Buchner et al.

(10) Patent No.: US 6,664,132 B1
(45) Date of Patent: Dec. 16, 2003

(54) METHOD FOR PRODUCING THREE-DIMENSIONAL CIRCUITS

(75) Inventors: Reinhold Buchner, Unterfoehring (DE); Peter Ramm, Pfaffenhofen (DE)

(73) Assignee: Fraunhofer-Gesellschaft zur Foerderung der Angewandten Forchung E.V., Munich (DE)

( * ) Notice: Subject to any disclaimer, the term of this patent is extended or adjusted under 35 U.S.C. 154(b) by 0 days.

(21) Appl. No.: 09/980,445
(22) PCT Filed: Apr. 10, 2000
(86) PCT No.: PCT/EP00/03172

§ 371 (c)(1),
(2), (4) Date: Nov. 29, 2001

(87) PCT Pub. No.: WO00/74136

PCT Pub. Date: Dec. 7, 2000

(30) Foreign Application Priority Data

May 31, 1999 (DE) ......................... 199 24 935

(51) Int. Cl.⁷ ............... H01L 21/48; H01L 21/50
(52) U.S. Cl. ...................... 438/109; 438/113
(58) Field of Search .............. 324/158.1, 765; 438/10, 12, 14, 15, 17, 106, 107, 109, 113

*Primary Examiner*—Evan Pert
(74) *Attorney, Agent, or Firm*—Glenn Patent Group; Michael A. Glenn

(57) ABSTRACT

In a method of producing three-dimensional circuits, a first and a second substrate are first provided, each of said substrates having arranged therein a plurality of components which have been tested with regard to their operability. The second substrate is diced so as to obtain a plurality of individual chips, each individual chip comprising at least one component. Subsequently, the individual chips are arranged on the first substrate and connected to said first substrate so that operative components in said first substrate are connected to individual chips including an operative component, and so that non-operative components in said first substrate are connected to chip elements having no function, so as to obtain a three-dimensional complete structure. Finally, the three-dimensional complete structure is diced so as to obtain three-dimensional circuits.

11 Claims, 3 Drawing Sheets

__US 6,664,132 B1__

METHOD FOR PRODUCING THREE-DIMENSIONAL CIRCUITS

FIELD OF THE INVENTION

The present invention relates to a method for producing three-dimensional circuits and especially three-dimensional integrated circuits.

BACKGROUND OF THE INVENTION AND PRIOR ART

Three-dimensional integration means the vertical connection of components which have been produced by means of planar technology. The advantages of a three-dimensional integrated microelectronic system are e.g. that, in comparison with two-dimensional systems, higher packaging densities and switching speeds can be achieved observing the same design rules. The latter is, on the one hand, due to shorter line paths between the individual components or circuits, and, on the other hand, it is due to the possibility of parallel data processing. The increase in the performance of the system will be optimal when a connection technology with locally freely selectable VLSI vertical contacts is realized.

For producing three-dimensional circuit arrangements with freely selectable vertical contacts, the following methods are already known:

Y. Akasaka, Proc. IEEE 74 (1986) 1703, suggests that polycrystalline silicon should be deposited on a fully processed layer of components and recrystallized so that further components can be produced in the recrystallized layer. Disadvantages of this method are the yield-reducing degradation of the components in the lower plane caused by the high thermal load occurring during the recrystallization process and the necessarily serial processing of the complete system. The latter causes, on the one hand, long processing times in the production process and, on the other hand, it results in a yield reduction due to a summation of the process-conditioned rejects. Both factors will substantially increase the production costs in comparison with processing of the individual planes separately from one another in different substrates.

Y. Hayashi et al Proc., 8$^{th}$ Int. Workshop on Future Electron Devices, 1990, p. 85, discloses that the individual component planes are first produced separately from one another in different substrates. Subsequently, the substrates are thinned to a thickness of a few millimeters, provided with contacts on the front and on the back and vertically connected by means of a bonding process. For providing the contacts on the back and on the front, special processes are, however, necessary which are not part of the standard semiconductor production technology (CMOS), viz. MOS-incompatible materials (e.g. gold) and the structuring of the back of the substrate.

U.S. Pat. No. 4,939,568 describes a method of producing a three-dimensional integrated circuit structure by stacking individual integrated circuits (ICs=integrated circuits) so as to form a stack of individual chips on a support substrate. For this purpose, a substrate with fully processed ICs is first divided into individual chips, whereby processing at the wafer level is finished. The chips are tested and a first individual chip is applied to a support substrate by means of thermocompression. After this step, a further chip is applied to the first chip in the same way. Hence, a first stack of chips is finished before the production of a further stack of chips on another support substrate is started. It follows that further processing of the stacks of chips at the wafer level is not possible by means of this method.

A substantial disadvantage of the above-described methods originates from the fact that the devices available in the field of silicon technology only permit processing of disk-shaped substrates, the so-called wafers. A processing of non-disk-shaped substrates, in particular of individual chips, is only possible in experimental plants, but not within the framework of an industrial production with the high yields demanded.

U.S. Pat. No. 4,954,875 describes a method for three-dimensional integration by stacking individual wafers in the case of which the connection of the individual component planes is established through specially shaped vias (through-holes). When substrates comprising a large number of identical components, the so-called chips, are combined, the resultant yield of a multilayer system results from the product of the individual yields. This has the effect that the yield of a system comprising a plurality of component planes, like the system disclosed in U.S. Pat. No. 4,954,875, decreases drastically according to the known methods. When the yield of an individual plane is, for example, 80%, the resultant total yield in the case of a complete system of 10 planes will only be approx. 10%, which means that such a system is no longer economical and that the use of this technology is limited to a few special fields of application. The yield of a component substrate also depends on the kind of circuits and on the production process used. The yields achieved in the production of storage components are, for example, very high, whereas the yield achieved in the case of logic chips, such as microprocessors, is markedly lower. In particular when several kinds of such circuits are stacked one on top of the other, the total yield is determined by the lowest-yield circuit type to a disproportionate degree.

U.S. Pat. No. 5,563,084 describes a method for producing a three-dimensional integrated circuit; making use of the conventional standard industrial equipment, this method achieves at the wafer level a substantial increase in yield in comparison with the yield of hitherto described methods. According to this method, two fully processed substrates are connected. The upper substrate is, however, previously subjected to a function test with the aid of which the intact chips of the substrate are selected. Subsequently, this substrate is thinned from the back, divided into individual chips and only selected, intact chips are applied in a juxtaposed, aligned mode of arrangement to the lower substrate which is provided with an adhesive layer. Due to the fact that only selected chips are applied, an increase in yield is achieved, but in the case of a defective sub-system intact chips are still applied and thus wasted, and this will entail unnecessary costs.

SUMMARY OF THE INVENTION

It is the object of the present invention to provide a method for producing a three-dimensional integrated circuit, which is improved in comparison with the above-described method and by means of which a high system yield is achieved at the wafer level making use of a conventional standard industrial equipment, the costs being low in comparison with the costs entailed by hitherto known methods.

This object is achieved by a method for producing three-dimensional circuits comprising the following steps: providing a first substrate and a second substrate, each of said substrates having arranged therein a plurality of components which have been tested with regard to their operability; dicing the second substrate so as to obtain a plurality of individual chips, each individual chip comprising at least one component; arranging the individual chips on the first substrate and connecting them to said first substrate so that operative components in said first substrate are connected to individual chips comprising an operative component, and so that non-operative components in said first substrate are connected to chip elements having no function, so as to obtain a three-dimensional complete structure; and dicing the three-dimensional complete structure so as to obtain three-dimensional circuits.

The present invention provides a method for producing three-dimensional circuits in the case of which a first and a second substrate are first provided, each of these substrates having arranged therein a plurality of components which have been tested with regard to their operability. Subsequently, the second substrate is diced so as to obtain a plurality of individual chips, each individual chip comprising at least one component. Following this, the individual chips are arranged on the first substrate and connected to the first substrate so that operative components in the first substrate are connected to individual chips comprising an operative component, and so that non-operative components in the first substrate are connected to chip elements having no function, so as to obtain a three-dimensional complete structure. Finally, the three-dimensional complete structure is diced so as to obtain the three-dimensional circuits.

According to a preferred embodiment, the step of providing the first and the second substrate comprises the production of the first substrate by processing a first semiconductor wafer so as to form a plurality of components therein and by forming a metallization structure for contacting the components, the testing of the plurality of components in the first substrate with regard to their operability so as to be able to differentiate between operative components and non-operative components, the production of the second substrate by processing a second semiconductor wafer so as to form the plurality of components therein and by forming a metallization structure, and the subsequent testing of the plurality of components in the second substrate with regard to their operability so as to be able to differentiate between operative individual chips and non-operative individual chips.

According to a further preferred embodiment, the chips used as chip elements having no function are the non-operative individual chips which are connected to non-operative components in the first substrate.

According to a further preferred embodiment, the first substrate may, in turn, already comprise a plurality of component layers in the form of stacks of components, and also the second substrate can have applied thereto further component planes in a chipwise mode of application after the application of the individual chips and before the dicing of the complete structure.

In total, the method according to the present invention uses known and accepted method steps so that, according to a special advantage of the present invention, it is not necessary to develop any new processes. One advantage of the present invention is to be seen in the fact that processing at the wafer level remains possible.

By means of the method according to the present invention only intact chips are applied to respective intact chips of the underlying component layers, whereas defective chips of the underlying component layers have applied thereto chips which are also defective. This means that the dependence of the yield of the complete system on the yield of the individual processed substrates is markedly reduced in an advantageous manner. It is possible to eliminate only individual defective chips of a component layer so that a single defective layer will no longer spoil whole stacks of components. It follows that the method according to the present invention will markedly increase the yield in the production of three-dimensional integrated circuits and it will reduce the production costs simultaneously.

BRIEF DESCRIPTION OF THE DRAWINGS

In the following, preferred embodiments of the present invention will be explained in detail making reference to the drawings enclosed, in which.

DETAILED DESCRIPTION OF THE PREFERRED EMBODIMENTS

Figure 1:
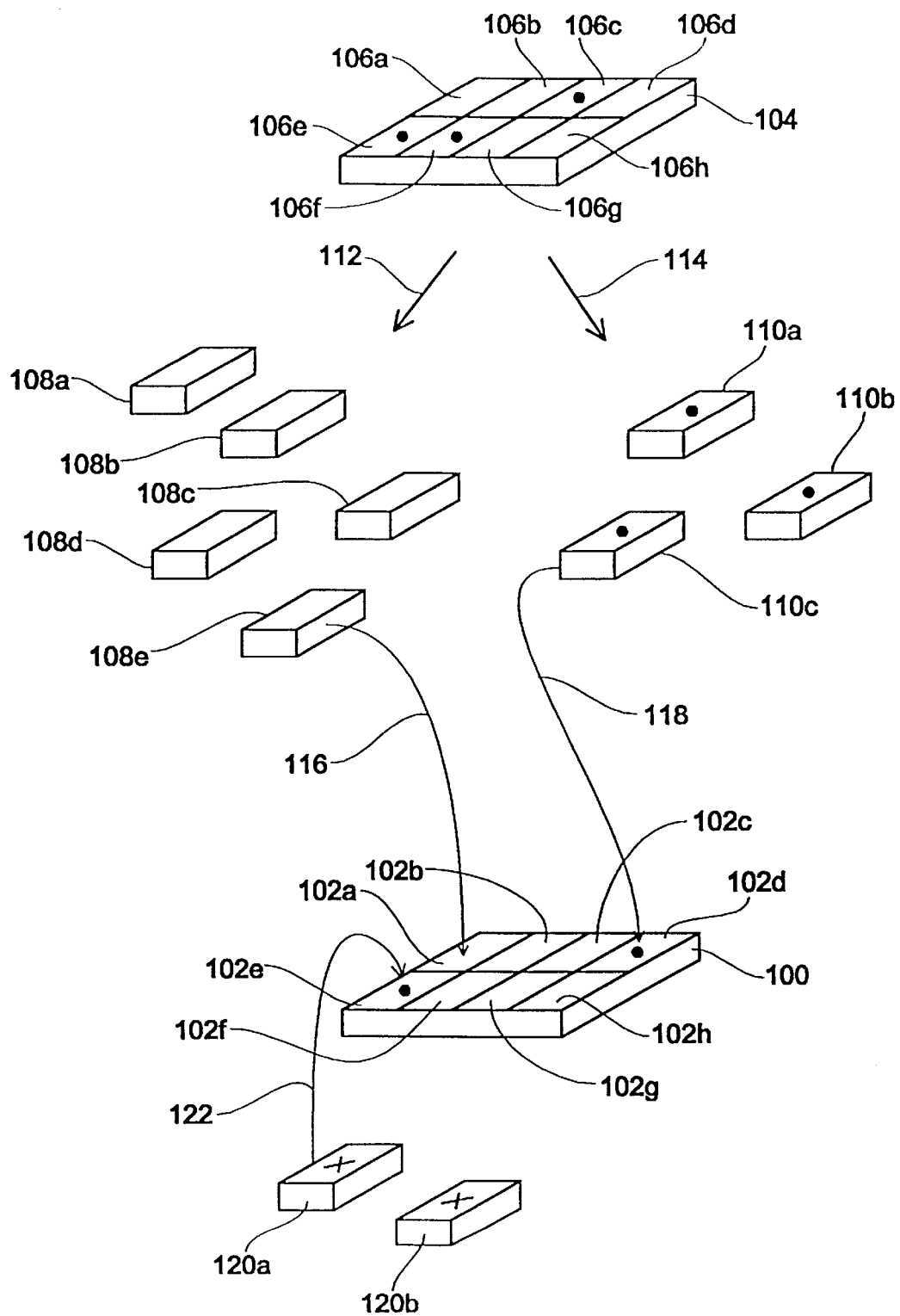
FIG. 1 shows a schematic representation of the method according to the present invention in accordance with a first embodiment.

Making reference to FIG. 1, a first preferred embodiment of the method for producing three-dimensional circuits according to the present invention will be explained in detail in the following. With regard to the description following hereinbelow, reference is made to the fact that identical reference numerals are used for identical or similar elements in the various figures.

To begin with, a first substrate 100 is provided, which has arranged therein a plurality of components 102a–102h which are shown only schematically in FIG. 1. These individual components 102a–102h may e.g. be storage components or logic chips, such as microprocessors; it will be advantageous to form only one kind of components in one substrate. Furthermore, reference is made to the fact that the representation is not true to scale and that, for the sake of clarity, only a small number of components is shown; it is, however, apparent, that, when such a substrate 100 is realized, it will have arranged therein a multitude of components.

The components 102a–102h arranged in the first substrate 100 have been tested with regard to their operability, i.e. a function test has already been carried out and the operative components 102a–102c and 102f–102h are not marked, whereas the non-operative components 102d and 102e are marked with a dot in the drawing for the sake of simplicity.

Furthermore, a second substrate 104 is provided, which, too, has arranged therein a plurality of components 106a–106h, the representation being similar to that of the above-described first substrate 100. Also the components 106a–106h have been tested with regard to their operability, the non-operative components 106c, 106e and 106f being marked by a spot. The operative components 106a, 106b, 106d, 106g and 106h are not specially marked.

In a following step, the second substrate 104 is diced so to obtain a plurality of operative individual chips 108a–108e as well as a plurality of non-operative individual chips 110a–110c, as indicated schematically by arrows 112 and 114. The operative individual chips 108a–108e comprise the components 106a, 106b, 106d, 106g and 106h of the second substrate 104 which have been tested with regard to their operability and deemed good, whereas the non-operative individual chips 110a–110c comprise the components 106c, 106e and 106f of the second substrate which have been tested with regard to their operability and deemed defective.

In a subsequent method step, the operative individual chips 108a–108e are arranged on the first substrate 100 and connected thereto, the operative individual chips 108a–108b being connected to the respective operative components 102a–102c and 102f–102h of the first substrate 100, as indicated schematically by arrow 116.

The non-operative individual chips 110a–110c are also arranged on the first substrate 100 and connected thereto; in the embodiment shown, the number of non-operative individual chips 110a–110c is larger than the number of non-operative components 102d and 102e in the first substrate 100 so that, in this case, only two of the non-operative individual chips 110a–110c are arranged on the first substrate 100 and connected to this first substrate in the above-described manner, as indicated schematically by arrow 118.

With respect to the operative individual chip that is missing in the example shown, reference is made to the fact that, in this case, a further operative individual chip can be used, which was e.g. not used in the case of a preceding production method.

Instead of the above-described use of the non-operative individual chips 110a–110c, which are connected to the non-operative components of the first substrate 100, it is also possible to use simple chip elements having no function 120a and 120b for connection to the non-operative components of the first substrate 100, as indicated by arrow 122. These chip elements having no function 120a, 120b may e.g. be suitably dimensioned semiconductors which have a suitable size and which have no structure or an arbitrary structure. In order to differentiate these chip elements having no function 120a–120b from the non-operative individual chips 110a–110c of the second substrate 104, they are marked with an "x" in the representations.

The connection of the individual chips to the respective components in the first substrate 100 comprises in addition to the mechanical connection also the electric connection between the components in the first substrate and the respective individual chips.

When all the individual chips have been arranged on the first substrate 100, a three-dimensional complete structure is obtained, which is diced in a final method step so as to obtain three-dimensional circuits; this method step is not shown in FIG. 1.

Making reference to FIG. 2, a three-dimensional complete structure will be described in the following. This three-dimensional complete structure is obtained in accordance with a second embodiment of the method according to the present invention. The three-dimensional complete structure is designated generally by reference numeral 130 and comprises the first substrate 100 having arranged thereon in a first plane 132 the individual chips which have been obtained by dicing the second substrate 104, as indicated by the broken lines. Furthermore, the three-dimensional structure 130 includes a second plane 134 comprising a plurality of individual chips 136a–136h which have been obtained by dicing a third substrate (not shown). Also this third substrate comprises a plurality of components which have been tested with respect to their operability, and, by dicing the third substrate, the individual chips 136a–136h shown in FIG. 2 have been formed; the individual chips 136a–136c and 136f 136hcomprise operative components, whereas the individual chips 136d and 136e comprise non-operative components.

Figure 2:
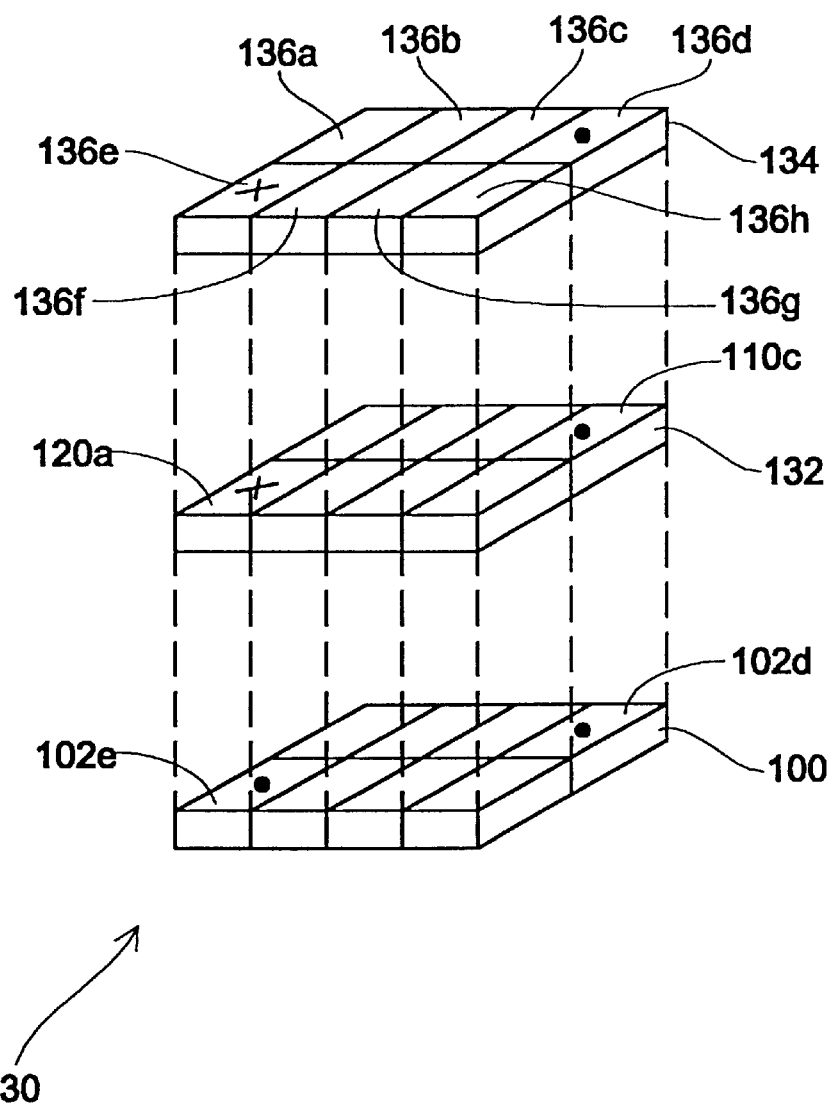
FIG. 2 shows a schematic representation of a resultant three-dimensional complete structure produced by the method according to the present invention in accordance with a second embodiment.

As far as FIG. 2 is concerned, reference is made to the fact that, for reasons of clarity, the designation of the individual chips in the second plane and of the components in the first substrate 100 has been omitted, with the exception of that of the non-operative parts.

As can additionally be seen from FIG. 2, the individual chips 136a–136h of the third substrate are arranged in a manner similar to that which has already been described hereinbefore with reference to FIG. 1, viz. in such a way that the operative individual chips of the third plane 134 are arranged on operative individual chips of the second plane 132 and connected to these individual chips in the second plane 132 and that, likewise, the non-operative individual chips of the second plane 134 are connected to the non-operative individual chips of the first plane 132.

Furthermore, reference is made to that fact that, when the second plane 134 is omitted in FIG. 2, the three-dimensional complete structure according to the method described with respect to FIG. 1 is obtained.

Figure 3:
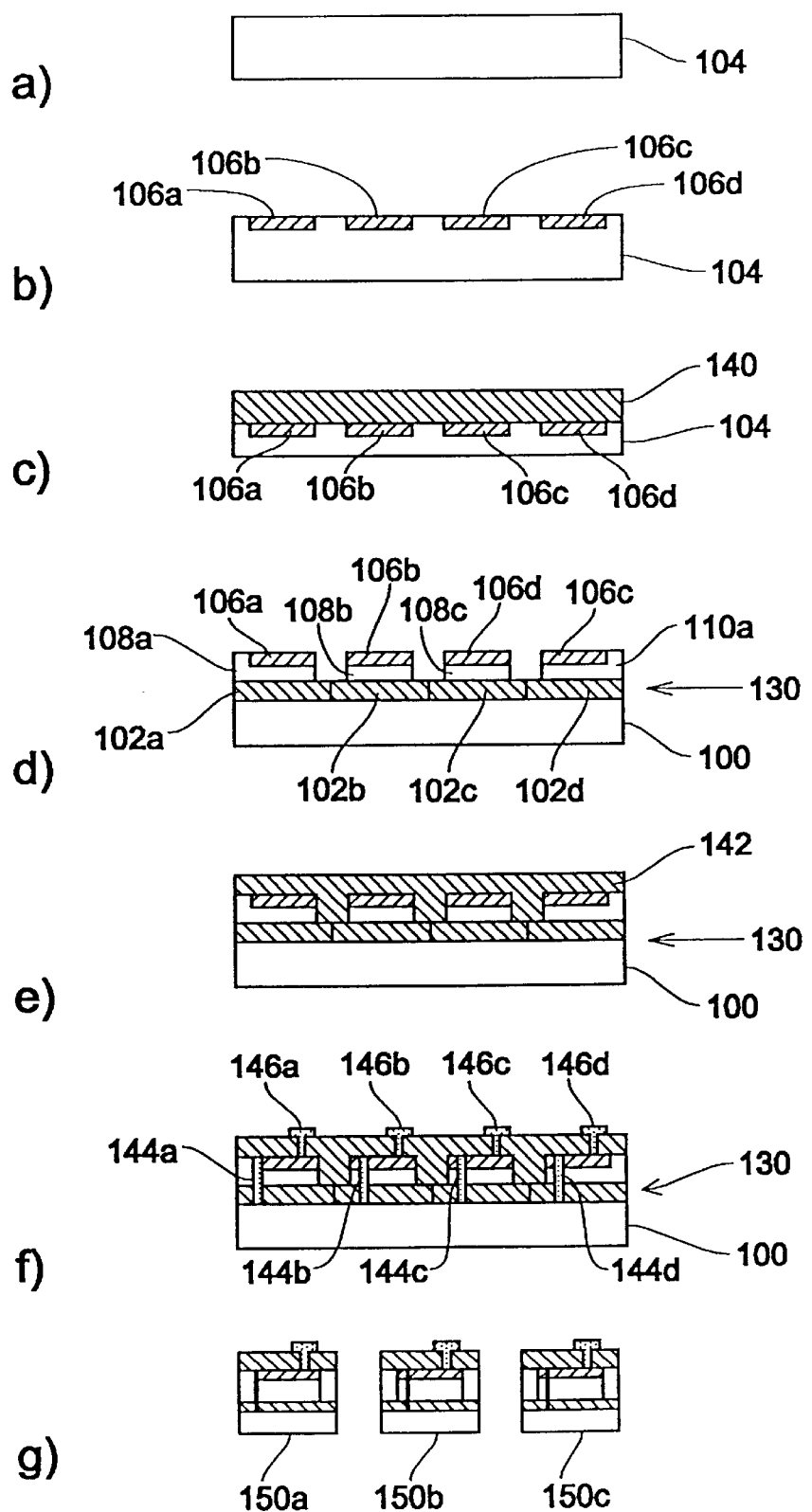
FIGS. 3a through 3g show individual steps of the method according to the present invention in accordance with a third embodiment.

Making reference to FIG. 3, the individual steps of the method according to the present invention in accordance with a third embodiment will be described in detail in the following.

In FIG. 3a the unprocessed second substrate 104 is shown, in which the individual components 106a–106d are formed by processing steps which are known per se, so that the structure shown in FIG. 3b is obtained. As can be seen in FIG. 3c, an auxiliary substrate 140 is then formed on the surface of the substrate 104 having the components 106a–106d formed therein. Subsequently, the substrate 104 is thinned from the surface which is opposed to the surface having the auxiliary substrate 140 arranged thereon. Following this, the substrate 104 is diced so as to create the operative individual chips 108a–108c with the operative components 106a, 106b and 106d shown in FIG. 3d as well as the non-operative individual chip 110a with the non-operative component 106c shown in FIG. 3d. In FIG. 3d these chips and components are already arranged on and connected to the first substrate 100, the respective individual chips 108a–108c being connected to the operative components 102a–102c in the first substrate, and the non-operative individual chip 110a being connected to the non-operative component 102d in the first substrate 100 (analogously to the description referring to FIG. 1). As can be seen, a circuit arrangement in the case of which the individual chips are separated by trenches is obtained by the dicing of the second substrate 104 and the arrangement of the individual chips on the first substrate 100. As can be seen from FIG. 3d, the auxiliary substrate 140 has been removed after the dicing step.

In order to permit further photolithographic processing of this stack, the resultant three-dimensional complete structure 130 is rendered planar by depositing a further layer 142, as can be seen in FIG. 3e.

In the subsequent step 3f, the electric connections between the individual chips and the components in the first substrate are established.

As can be seen, an electric connection 144a–144d is formed, in a manner known per se, between the individual components in the chips and the individual components in the first substrate 100, and, likewise, contacts 146a–146d of the components in the individual chips contacting the surface of the three-dimensional complete structure 130 are formed.

Subsequently, the three-dimensional complete structure 130 is diced so that the individual three-dimensional circuits 150a–150c shown in FIG. 3g are obtained. In this respect, reference is made to the fact that only the three circuits shown are obtained, since the fourth circuit is defined by non-operative components and has been eliminated consequently.

With respect to the above-described method, reference is made to the fact that the thinning of the second substrate 104 can be effected e.g. by grinding or etching and that the substrates used can e.g. be monocrystalline silicon substrates, SOI substrates or III–V semiconductor substrates.

Furthermore, reference is made to the fact that, according to a preferred embodiment, the surface of the first substrate 100, to which the individual chips are applied, is provided with an adhesive layer.

As is clearly evident from the above description, the present invention provides a method in the case of which two fully processed substrates 100, 104 (wafers), which each include circuit structures 102a–102h, 106a–106h and metallization planes 144a–144d and 146a–146d, are interconnected e.g. by means of the adhesive layer. This adhesive layer may additionally have a passivating function and/or it may render the surface planar. The two substrates 100, 102 are subjected to a function test before they are connected; by means of this function test, the intact chips 102a–102c, 102f–102h and 106a, 106b, 106d, 106g and 106h are determined. Finally, the upper (second) substrate 104 is thinned from the back and divided into individual chips 108a–108e and 110a–110c. These chips are now incorporated into the above-described two groups, viz. operative chips 108a–108e and defective chips 110a–110c. Following this, the chips of the second component plane are applied to the lower substrate 100 (first substrate), which is provided with an adhesive layer, in a juxtaposed, aligned mode of arrangement, whereby a new chip plane 132 is composed of these chips. In order to achieve a high system yield as well as low costs, intact chips of the lower plane have exclusively applied thereto selected, intact chips of the upper plane, whereas defective chips of the lower plane have exclusively applied thereto defective chips of the upper plane. Instead of a defective chip, a correspondingly sized piece of a semiconductor substrate 120a, 120b having no structure at all or having an arbitrary structure can be used alternatively.

The lower substrate 100 may also comprise a plurality of component layers in the form of stacks of components. The chips of the upper substrate 104 are either subjected to the function test within the framework of the present method, or a substrate which has already been checked and which comprises tested and e.g. marked defective chips is provided and used. Finally, the upper substrate 104 has applied thereto the auxiliary substrate 140 before it is thinned and divided. Instead of thinning the upper substrate down to a level close to the component layers, the substrate area below the oxide layer can be removed in the case of an SOI substrate.

Since individual chips have now been applied to the lower substrate, a continuous surface no longer exists—trenches have been formed between the chips. Specific process steps, especially photolithographic modules, can now no longer be carried out with a high yield. Hence, the above-described planarization step is now preferably inserted.

The further course of action corresponds to the method described in U.S. Pat. No. 5,563,084 whose disclosure is herewith incorporated by reference.

In a similar way, also a further component plane 134 can be applied chipwise. The hitherto produced stack of components and the associated substrate serve here as a new lower substrate. In the case of the method according to the present invention, the number of planes is not limited, and, in addition, not only an individual plane but also a sub-stack, which already comprises a plurality of planes, can be applied chipwise.

What is claimed is:

1. A method for producing three-dimensional circuits comprising the following steps:
  a) providing a first substrate and a second substrate, each of said substrates having arranged therein a plurality of components which have been tested with regard to their operability;
  b) dicing the second substrate so as to obtain a plurality of individual chips, each individual chip comprising at least one component;
  c) arranging the individual chips on the first substrate and connecting them to said first substrate so that operative components in said first substrate are connected to individual chips comprising an operative component, and so that non-operative components in said first substrate are connected to chip elements having no function, so as to obtain a three-dimensional complete structure; and
  d) dicing the three-dimensional complete structure so as to obtain three-dimensional circuits.

2. A method according to claim 1, wherein the chip elements having no function are individual chips which are obtained by dicing the second substrate and which include a non-operative component, or wherein they are a suitably sized substrate having no structure or an arbitrary structure.

3. A method according to claim 1, wherein a third substrate is provided, which has arranged therein a plurality of components that have been tested with regard to their operability, the third substrate being diced into individual chips which each include at least one component, the following step being carried out prior to step d):
  arranging the individual chips of the third substrate on and connecting said individual chips of the third substrate to the individual chips of the second substrate so that operative individual chips of the second substrate are connected to individual chips including an operative component of the third substrate, and that non-operative individual chips of the second substrate are connected to chip elements having no function.

4. A method according to claim 1, wherein step c) comprises the electrical connection of the components in the first substrate to the individual chips.

5. A method according to claim 4, wherein the step of electrically connecting comprises the following steps:
  rendering the surface of the three-dimensional complete structure planar; and
  forming electric connections between the individual chips and the components in the first substrate.

6. A method according to claim 1, wherein step b) comprises the following steps:
  connecting a surface of the second substrate to an auxiliary substrate;
  thinning the second substrate from the surface located opposite said first-mentioned surface; and
  dicing the auxiliary substrate;
  the auxiliary substrate being removed prior to step d).

7. A method according to claim 6, wherein the second substrate is thinned by grinding or etching.

8. A method according to claim 1, wherein the first substrate is a three-dimensional complete structure which is produced according to steps a) to c).

9. A method according to claim 1, wherein the individual chips are connected to the first substrate via an adhesive layer.

10. A method according to claim 1, wherein the first and the second substrate are a monocrystalline silicon substrate, an SOI substrate or a III–V semiconductor substrate.

11. A method according to claim 1, wherein step a) comprises the following steps:
   producing the first substrate by the following steps:
      processing a first semiconductor wafer so as to form the plurality of components therein; and
      forming a metallization structure;
   testing the plurality of components in said first substrate with regard to their operability so as to be able to differentiate between operative components and non-operative components;
   producing the second substrate by the following steps:
      processing a second semiconductor wafer so as to form the plurality of components therein; and
      forming a metallization structure; and
   testing the plurality of components of said second substrate with regard to their operability so as to be able to differentiate between operative individual chips and non-operative individual chips.

* * * * *